United States Patent
Chen et al.

(10) Patent No.: US 10,418,518 B2
(45) Date of Patent: Sep. 17, 2019

(54) NITRIDE UNDERLAYER AND FABRICATION METHOD THEREOF

(71) Applicant: XIAMEN SANAN OPTOELECTRONICS TECHNOLOGY CO., LTD., Xiamen (CN)

(72) Inventors: Shengchang Chen, Xiamen (CN); Wen-Yu Lin, Xiamen (CN); Jie Zhang, Xiamen (CN); Heqing Deng, Xiamen (CN); Chen-Ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/859,512

(22) Filed: Dec. 30, 2017

(65) Prior Publication Data
US 2018/0145214 A1 May 24, 2018

Related U.S. Application Data

(63) Continuation of application No. PCT/CN2016/111661, filed on Dec. 23, 2016.

(30) Foreign Application Priority Data
Jan. 15, 2016 (CN) .......................... 2016 1 0024968

(51) Int. Cl.
*H01L 21/44* (2006.01)
*H01L 33/00* (2010.01)
(Continued)

(52) U.S. Cl.
CPC .......... *H01L 33/12* (2013.01); *H01L 21/0254* (2013.01); *H01L 21/0262* (2013.01); *H01L 21/02458* (2013.01); *H01L 21/02494* (2013.01); *H01L 21/02631* (2013.01); *H01L 33/007* (2013.01); *H01L 33/22* (2013.01); *H01L 33/32* (2013.01)

(58) Field of Classification Search
CPC ..................................................... H01L 33/002
USPC .......................... 257/102; 438/660–665, 799
See application file for complete search history.

(56) References Cited

U.S. PATENT DOCUMENTS 7,977,224 B2 * 7/2011 Hager ................... H01L 21/324
438/522
9,219,111 B2 * 12/2015 Kobayashi .............. H01L 33/32
257/22
(Continued)

FOREIGN PATENT DOCUMENTS

CN              103367589 A    10/2013

*Primary Examiner* — Calvin Lee
(74) *Attorney, Agent, or Firm* — Syncoda LLC; Feng Ma

(57) ABSTRACT

A fabrication method of a nitride underlayer structure includes, during AlN layer sputtering with PVD, a small amount of non-Al material is doped to form nitride with decomposition temperature lower than that of AlN. A high-temperature annealing is then performed. After annealing, the AlN layer has a rough surface with microscopic ups and downs instead of a flat surface. By continuing AlGaN growth via MOCVD over this surface, the stress can be released via 3D-2D mode conversion, thus improving AlN cracks.

9 Claims, 2 Drawing Sheets

(51) Int. Cl.
*H01L 33/12* (2010.01)
*H01L 33/22* (2010.01)
*H01L 21/02* (2006.01)
*H01L 33/32* (2010.01)

(56) References Cited

U.S. PATENT DOCUMENTS 9,293,646 B2 * 3/2016 Takano ................. H01L 33/007
9,754,783 B2 * 9/2017 Takashima .............. C23C 16/56

* cited by examiner

NITRIDE UNDERLAYER AND FABRICATION METHOD THEREOF

CROSS-REFERENCE TO RELATED APPLICATIONS

The present application is a continuation of, and claims priority to, PCT/CN2016/111661 filed on Dec. 23, 2016, which claims priority to Chinese Patent Application No. 201610024968.7 filed on Jan. 15, 2016. The disclosures of these applications are hereby incorporated by reference in their entirety.

BACKGROUND

Deep ultraviolet AlGaN light-emitting diodes have huge potential application values and prospects in such fields as sterilization and disinfection, medicine, biochemical detection, high-density information storage, white light lighting and secure communication, and have attracted increasing interests from researchers and institutions.

SUMMARY

The inventors of the present disclosure have recognized that the large mismatch between AlGaN and common substrate leads to generally low light-emitting efficiency in current deep ultraviolet LEDs. It is a key technique to improve light-emitting efficiency of deep ultraviolet LEDs by using AlN as the buffer layer to obtain crack-free AlN film with high crystalline quality.

More and more test results have shown evidences that: by using sputtered AlN material over the sapphire substrate as a buffer layer for further growing nitride film, high-quality underlayer material can be obtained, and light output efficiency of the light-emitting diode can be greatly improved. For example, sputter an AlN layer over the sapphire substrate as the buffer layer, and grow an AlN film over this sputtered AlN buffer layer via MOCVD, which can greatly decrease diffraction half-wave width of XRD (102). However, surface of the sputtered AlN buffer layer is extremely flat, and cannot form discontinuous film surface and provide stress release path, resulting in serious surface crack.

To solve serious surface cracks when a nitride film is grown over the sputtered AlN buffer layer, the present disclosure provides a fabrication method of nitride underlayer structure, wherein, when the AlN layer is sputtered via PVD, a small amount of non-Al materials such as Ga and In are doped to form nitride with decomposition temperature lower than that of AlN. Anneal AlN under high temperature after depositing, and the annealed AlN layer appears ups and downs microscopically instead of a flat surface. By continuing AlGaN growth via MOCVD over this surface, the stress can be released by 3D-2D mode conversion, thus improving AlN cracks.

According to one aspect of the present disclosure, a fabrication method of a nitride underlayer includes: 1) providing a substrate; 2) sputtering an AlN layer over a surface of the substrate, wherein, during sputtering, doping non-Al material with decomposition temperature lower than that of AlN when Al source is input to form nitride; 3) annealing the AlN layer to form a rough surface; and 4) depositing an $Al_xGa_{1-x}N$ layer ($0 \leq x \leq 1$) over the AlN layer via MOCVD.

In some embodiments of the present disclosure, the non-Al materials are desorbed during annealing to form a rough surface.

In some embodiments, the non-Al material in step 2) can be In, Ga or their combination.

In some embodiments, the doped non-Al material accounts for less than 10% of the Al source.

In some embodiments, in step 3), preset temperature is 600-2,000° C.

In some embodiments, in step 4), the $Al_xGa_{1-x}N$ layer grown via MOCVD releases stress via 3D-2D mode conversion over the rough surface.

According to another aspect of the present disclosure, a fabrication method of a light-emitting diode includes: 1) providing a substrate; 2) sputtering an AlN layer over the substrate surface, wherein, during sputtering, doping non-Al material with decomposition temperature lower than that of AlN when Al source is input to form nitride; 3) annealing the AlN layer to form a rough surface; 4) depositing an $Al_xGa_{1-x}N$ layer ($0 \leq x \leq 1$) over the AlN layer via MOCVD; and 5) depositing an n-type nitride layer, an active layer and a p-type nitride layer over the $Al_xGa_{1-x}N$ layer.

In some embodiments, a light-emitting wavelength of the active layer is 365 nm-210 nm.

According to a third aspect of the present disclosure, a fabrication method of a light-emitting system includes fabricating a plurality of light-emitting diodes, which further includes: 1) providing a substrate; 2) sputtering an AlN layer over a surface of the substrate; during sputtering, doping non-Al material with decomposition temperature lower than that of AlN when Al source is input to form nitride; 3) annealing the AlN layer to form a rough surface; 4) depositing an $Al_xGa_{1-x}N$ layer ($0 \leq x \leq 1$) over the AlN layer via MOCVD; and 5) depositing an n-type nitride layer, an active layer and a p-type nitride layer over the $Al_xGa_{1-x}N$ layer.

In some embodiments, a light-emitting wavelength of the active layer is 365 nm-210 nm.

In some embodiments, the doped non-Al material is not more than 10% of Al source and the non-Al material is desorbed during annealing to form a rough surface.

In some embodiments, the non-Al material in step 2) can be In, Ga or their combination and an annealing temperature is 600-2,000° C.

In some embodiments, in step 4), the $Al_xGa_{1-x}N$ layer grown via MOCVD releases stress via 3D-2D mode conversion over the rough surface.

The nitride underlayer structure fabricated according to the method aforesaid can be applied in light-emitting diodes, in particular, deep-ultraviolet light-emitting diodes. A crack-free AlN underlayer with high lattice quality can be obtained through the aforesaid fabrication method. After growth of epitaxial material layers, a light-emitting diode with high light-emitting efficiency can be obtained.

Other features and advantages of this present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

DETAILED DESCRIPTION

Various embodiments of the present disclosure will be described in detail with reference to the accompanying drawings and examples, to help understand and practice the disclosed embodiments, regarding how to solve technical problems using technical approaches for achieving the technical effects. It should be understood that the embodiments and their characteristics described in this disclosure may be combined with each other and such technical proposals are deemed to be within the scope of this disclosure without departing from the spirit of this disclosure.

Embodiment 1

Figure 1:
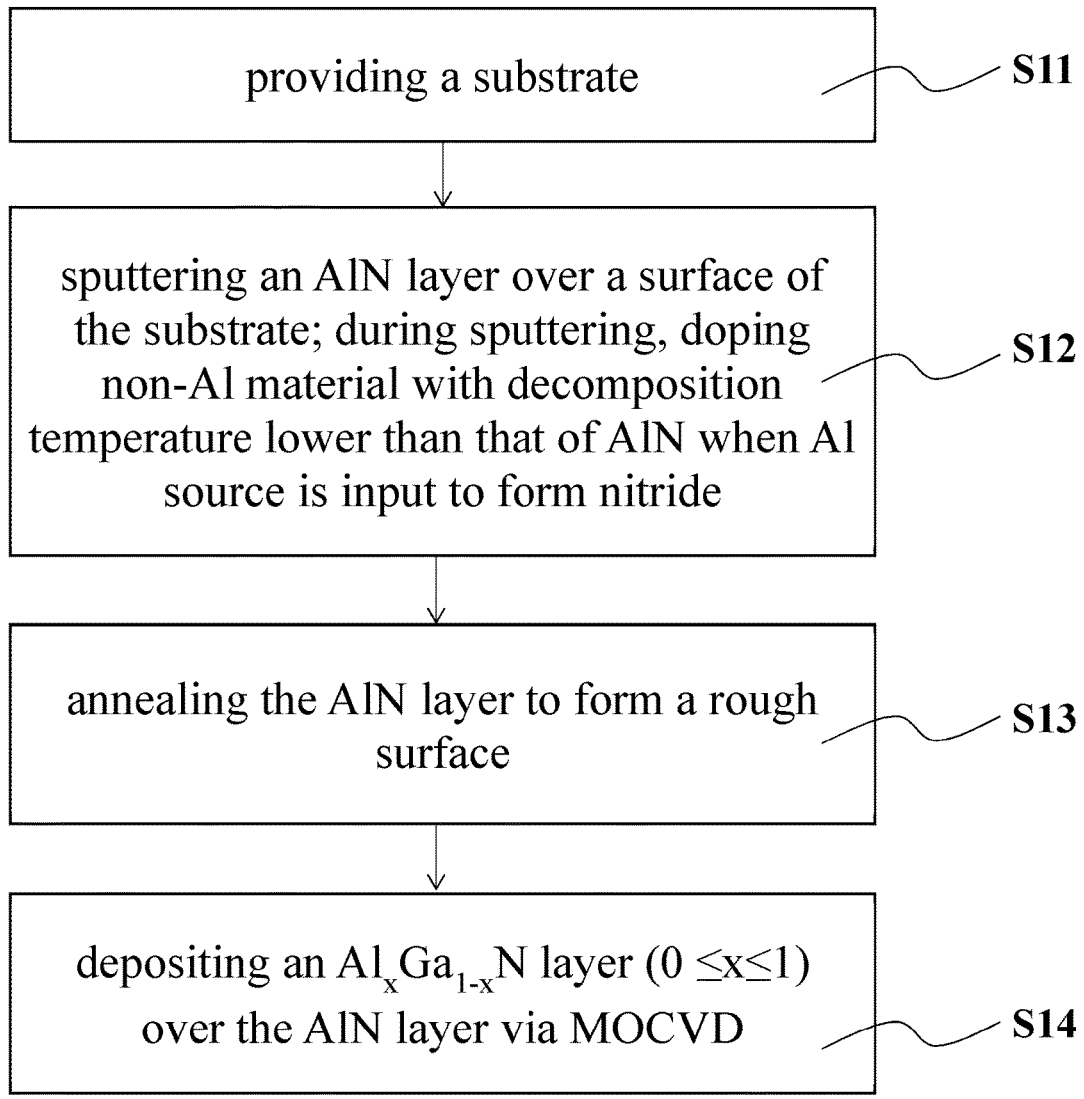
FIG. 1 shows a flowchart of fabricating a nitride underlayer according to some embodiments of the present disclosure.

FIG. 1 shows a flowchart of a fabrication method of a nitride underlayer according to the embodiments of the present disclosure, which includes steps S11: providing a substrate; S12: sputtering an AlN layer over a surface of the substrate; during sputtering, doping non-Al material with decomposition temperature lower than that of AlN when Al source is input to form nitride; S13: annealing the AlN layer to form a rough surface; and S14: depositing an AlxGa1-xN layer (0≤x≤1) over the AlN layer via MOCVD.

Figure 2:
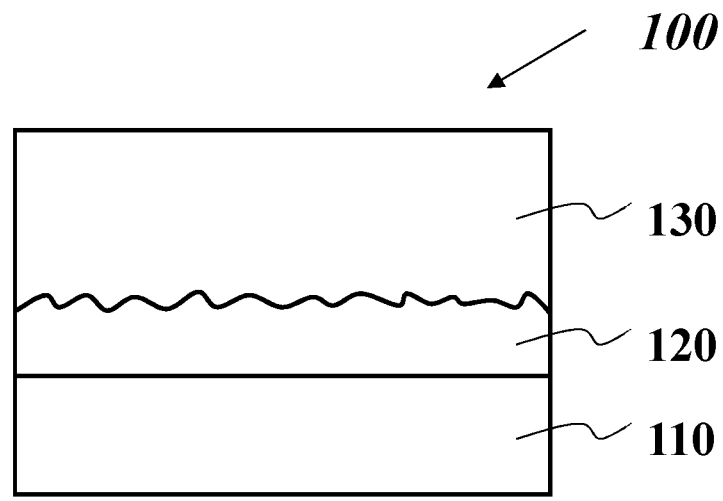
FIG. 2 illustrates a sectional view of a nitride underlayer structure according to some embodiments of the present disclosure.

Details are as described below with reference also to FIGS. 2 and 3.

First, provide a substrate 110, which can be sapphire, AlN, GaN, Si, SiC or other materials. A surface of the substrate can be a plane structure or a patterned structure. In this embodiment, a sapphire plain substrate is adopted.

Next, place the substrate 110 in the PVD chamber, and adjust the chamber temperature to 300-600° C. and pressure to 2-10 mtoor; deposit an AlN film layer 120 with a thickness of 10-350 nm via PVD; during depositing, dope a small amount of Ga metals, with amount less than 10% of the Al metal for inclusion formation of a small amount of GaN in the AlN film layer.

After deposition, anneal the substrate deposited with the AlN film layer 120 under high temperature with annealing temperature of 1,100-2,000° C. As the Ga component would get seriously desorbed when temperature is higher than 1,077° C., the annealed AlN film layer 120 has a rough surface with microscopic ups and downs instead of a flat surface. In this embodiment, preferred annealing temperature is 1,080-1,200° C.

Finally, put the substrate deposited with AlN film layer 120 to the CVD chamber, and adjust the chamber temperature to 400° C.-600° C. Then, input metal source, NH$_3$ and H$_2$ for epitaxial growth of the Al$_x$Ga$_{1-x}$N layer 130 (0≤x≤1). This layer is 1-100 nm thick and covers the AlN film layer 120. FIG. 2 illustrates a sectional view of the nitride underlayer after growing the Al$_x$Ga$_{1-x}$N layer 130. During this process, as the Al atom surface has poor migration capacity, Al atoms would preferably form island aggregation with ups and downs during Al$_x$Ga$_{1-x}$N growth via MOCVD. Then, the small island grows to big island. When the island area gets larger, two adjacent islands or several islands would encounter and get mutually merged. The merging process includes island enlarging, mutual extrusion, and gradual thickening, etc. The pressure stress from extrusion would set off some tensile stress due to mismatch between the film and the substrate, thus decreasing tensile stress and improving cracks of the AlN layer.

In the abovementioned method, the PVD-deposited AlN film can improve AlN crystalline quality during MOCVD growth. In addition, macro roughening is introduced to improve film stress for solving crack problem.

Figure 3:
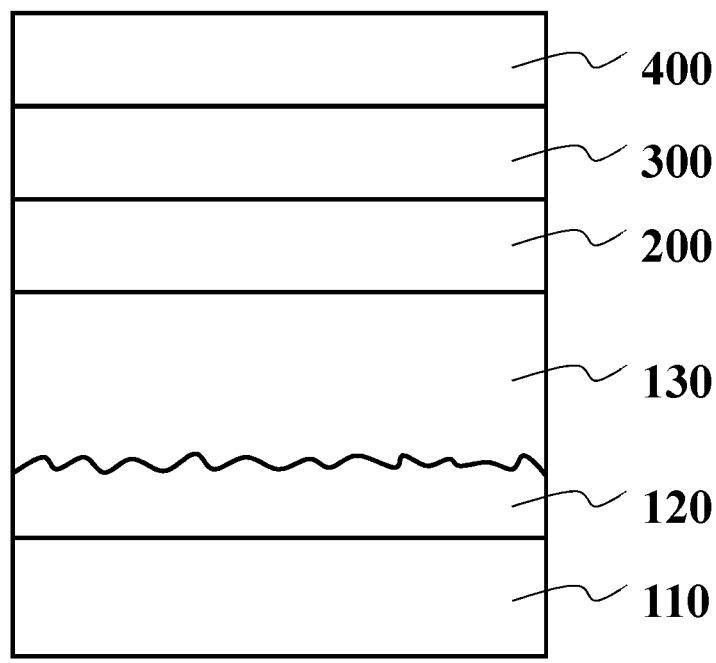
FIG. 3 illustrates a sectional view of a nitride light-emitting diode according to some embodiments the present disclosure.

FIG. 3 illustrates a sectional view of a LED structure over the nitride underlayer structure 100, which at least includes an n-type semiconductor layer 200, an active layer 300 and a p-type semiconductor layer 400. In general, the AlN material can allow light emission as low as about 200 nm, especially suitable for growth of deep-ultraviolet LEDs. In this embodiment, the Al$_x$In$_{1-x-y}$Ga$_y$N layer 130 of the nitride underlayer structure 100 is AlN material. An n-type semiconductor layer 200, an active layer 300 and a p-type semiconductor layer 400 are formed over the AlN underlayer 100 with AlGaN material, which can realize high-quality ultraviolet LED with wavelength of 210-365 nm.

Embodiment 2

Different from Embodiment 1, when the AlN film layer 120 is sputtered via PVD, a small amount of In metal is sputtered for inclusion formation of a small amount of InN material in the AlN film layer; in this way, the AlN film layer 120 sputtered via PVD is annealed to a rough surface under high temperature. As InN material can be decomposed at about 800° C., annealing temperature in this embodiment is controlled at 800-1,000° C.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A fabrication method of a nitride underlayer, the method comprising:
   1) providing a substrate;
   2) sputtering an AlN layer over a surface of the substrate; during the sputtering, doping non-Al material with a decomposition temperature lower than that of AlN when Al source is input to form nitride, wherein the non-Al material comprises Ga;
   3) annealing the AlN layer at an annealing temperature of 1080° C.-1200° C. to facilitate desorption of the Ga to thereby form a rough surface; and
   4) depositing an Al$_x$Ga$_{1-x}$N layer (0≤x≤1) over the AlN layer via MOCVD.

2. The fabrication method of claim 1, wherein the fabricated nitride underlayer comprises, from bottom up:
   the substrate;
   the AlN layer over a surface of the substrate with the rough surface; and
   the Al$_x$Ga$_{1-x}$N layer (0≤x≤1).

3. The fabrication method of claim 1, wherein in step 4), the $Al_xGa_{1-x}N$ layer grown via MOCVD releases stress via 3D-2D mode conversion over the rough surface.

4. The fabrication method of claim 1, wherein the doped non-Al material is not more than 10% of Al source.

5. A fabrication method of a light-emitting diode, the method comprising:
   1) providing a substrate;
   2) sputtering an AlN layer over a surface of the substrate; during sputtering, doping non-Al material with decomposition temperature lower than that of AlN when Al source is input to form nitride, wherein the non-Al material comprises Ga;
   3) annealing the AlN layer at an annealing temperature of 1080° C.-1200° C. to facilitate desorption of the Ga to thereby form a rough surface;
   4) depositing an $Al_xGa_{1-x}N$ layer (0≤x≤1) over the AlN layer via MOCVD; and
   5) depositing an n-type nitride layer, an active layer and a p-type nitride layer over the $Al_xGa_{1-x}N$ layer.

6. The fabrication method of claim 5, wherein, in step 4), the $Al_xGa_{1-x}N$ layer grown via MOCVD releases stress via 3D-2D mode conversion over the rough surface.

7. The fabrication method of claim 5, wherein, a light-emitting wavelength of the active layer is 365 nm-210 nm.

8. The fabrication method of claim 5, wherein, the doped non-Al material is not more than 10% of Al source.

9. A light-emitting diode fabricated with a fabrication method comprising:
   1) providing a substrate;
   2) sputtering an AlN layer over a surface of the substrate; during the sputtering, doping non-Al material with decomposition temperature lower than that of AlN when Al source is input to form nitride, wherein the non-Al material comprises Ga;
   3) annealing the AlN layer at an annealing temperature of 1080° C.-1200° C. to facilitate desorption of the Ga to thereby form a rough surface;
   4) depositing an $Al_xGa_{1-x}N$ layer (0≤x≤1) over the AlN layer via MOCVD; and
   5) depositing an n-type nitride layer, an active layer and a p-type nitride layer over the $Al_xGa_{1-x}N$ layer;

The light-emitting diode comprising, from bottom to up:
   the substrate;
   the AlN layer over a surface of the substrate with a rough surface;
   the $Al_xGa_{1-x}N$ layer (0≤x≤1);
   the n-type nitride layer;
   the active layer; and
   the p-type nitride layer.

* * * * *